(12) United States Patent
Ko et al.

(10) Patent No.: US 11,437,303 B2
(45) Date of Patent: Sep. 6, 2022

(54) FLOATED SINGULATION

(71) Applicant: Texas Instruments Incorporated, Dallas, TX (US)

(72) Inventors: Chang-Yen Ko, Taipei (TW); J K Ho, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/273,152

(22) Filed: Feb. 12, 2019

(65) Prior Publication Data
US 2020/0258819 A1    Aug. 13, 2020

(51) Int. Cl.
*H01L 23/495* (2006.01)
*H01L 23/00* (2006.01)
*H01L 21/82* (2006.01)
*H01L 23/31* (2006.01)
*H01L 23/64* (2006.01)

(52) U.S. Cl.
CPC ........ *H01L 23/49503* (2013.01); *H01L 21/82* (2013.01); *H01L 23/3121* (2013.01); *H01L 23/49548* (2013.01); *H01L 23/49575* (2013.01); *H01L 23/645* (2013.01); *H01L 24/09* (2013.01); *H01L 24/17* (2013.01); *H01L 24/33* (2013.01); *H01L 24/49* (2013.01); *H01L 24/73* (2013.01)

(58) Field of Classification Search
CPC ... H01L 23/49503; H01L 24/33; H01L 24/09; H01L 24/17; H01L 24/49; H01L 21/82; H01L 24/73; H01L 23/49548; H01L 23/3121; H01L 23/49575; H01L 23/645; H01L 23/495; H01L 23/5227; H01L 28/10; H01L 23/49822; H01L 23/528; H01L 24/94

See application file for complete search history.

(56) References Cited

U.S. PATENT DOCUMENTS

| | | | | |
|---|---|---|---|---|
| 8,067,267 B2 * | 11/2011 | Haba | ...................... | H01L 25/50 438/107 |
| 8,791,533 B2 * | 7/2014 | Chen | ................... | H01L 25/0655 257/421 |
| 2006/0043509 A1 * | 3/2006 | Watkins | ............ | H01L 27/14618 257/431 |
| 2007/0247268 A1 * | 10/2007 | Oya | .................... | H01L 23/3128 336/200 |
| 2017/0178787 A1 * | 6/2017 | Massolini | ........... | H01F 41/0206 |
| 2019/0221349 A1 * | 7/2019 | Wolter | ................ | H01L 23/5227 |

* cited by examiner

*Primary Examiner* — Shouxiang Hu
(74) *Attorney, Agent, or Firm* — Dawn Jos; Charles A. Brill; Frank D. Cimino

(57) ABSTRACT

A microelectronic device has a substrate attached to a substrate pad on a first face of the substrate, and a component attached to the substrate on the first face. The substrate has a component placement guide on the first face. The substrate has a singulation guide on a second face of the substrate, located opposite from the first face. The microelectronic device is formed by attaching the component to a substrate sheet which contains the substrate. The substrate sheet with the component is mounted on a singulation film so that the component contacts the singulation film. The singulation guide on the second face of the substrate is located opposite from the singulation film. The substrate is singulated from the substrate sheet. The substrate with the component is attached to the substrate pad on the first face of the substrate, adjacent to the component.

14 Claims, 8 Drawing Sheets

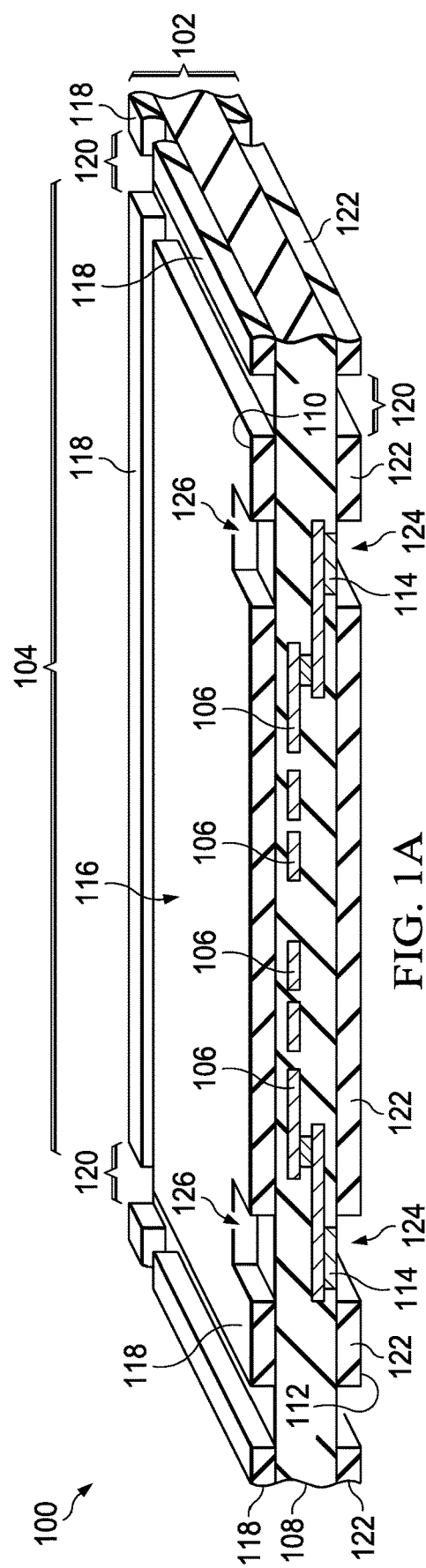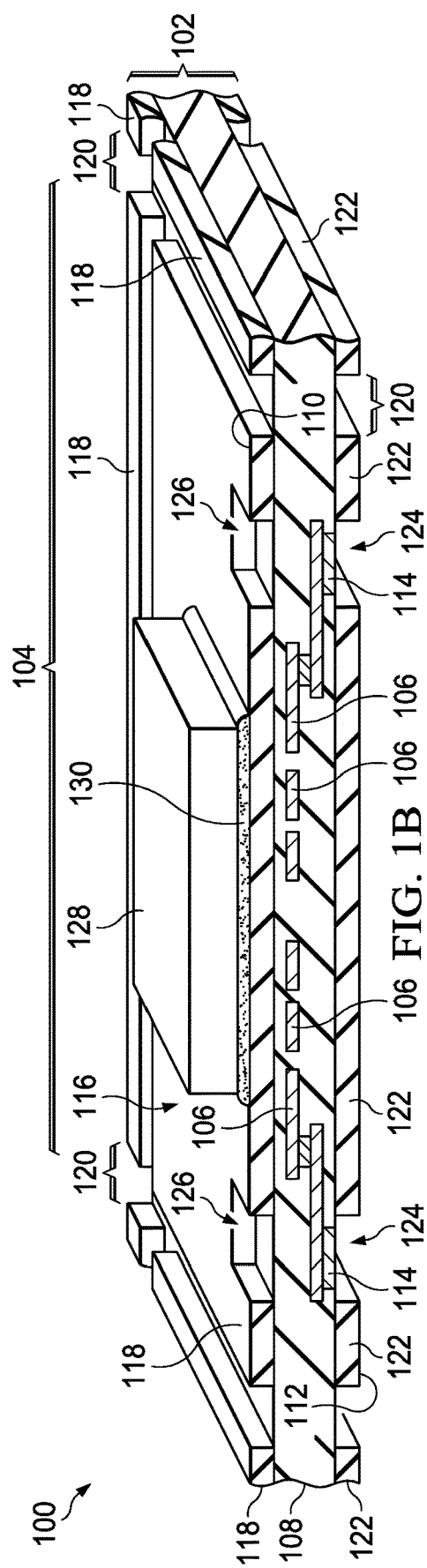

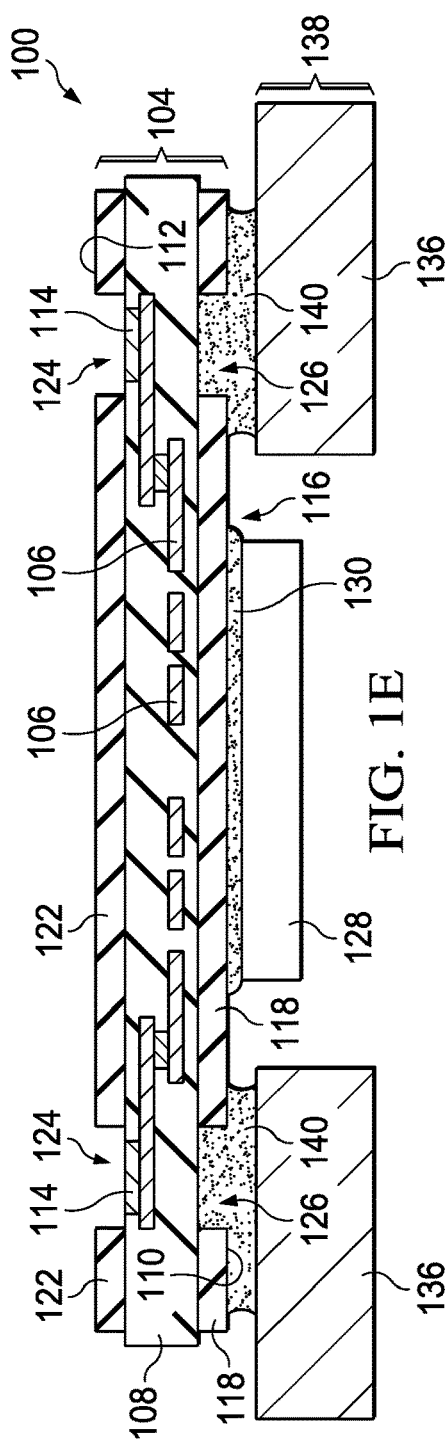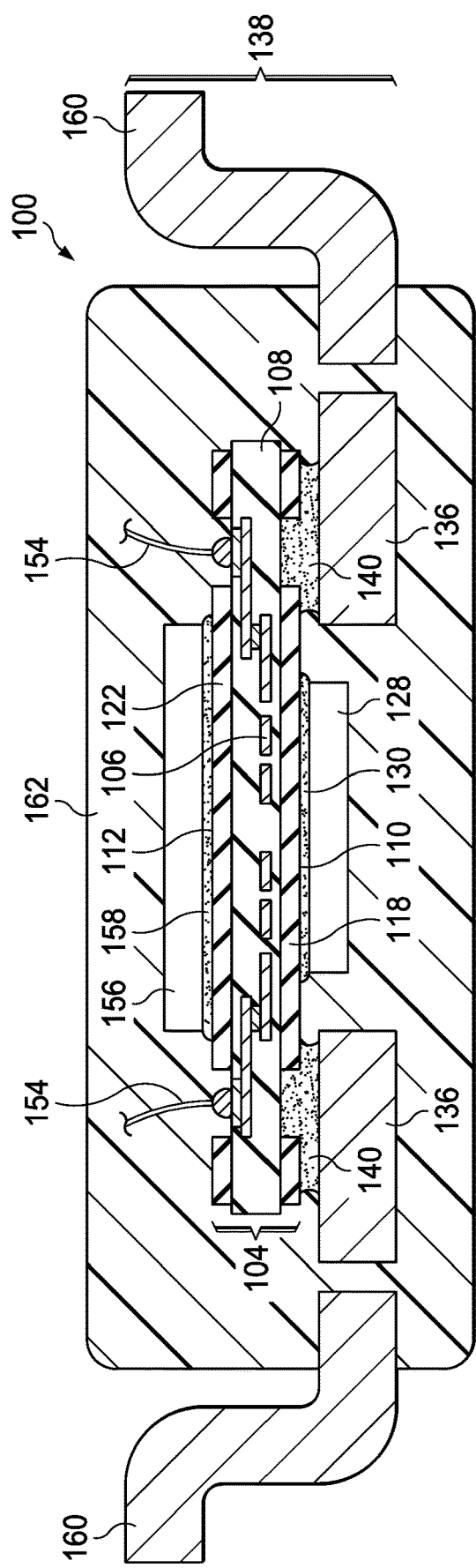

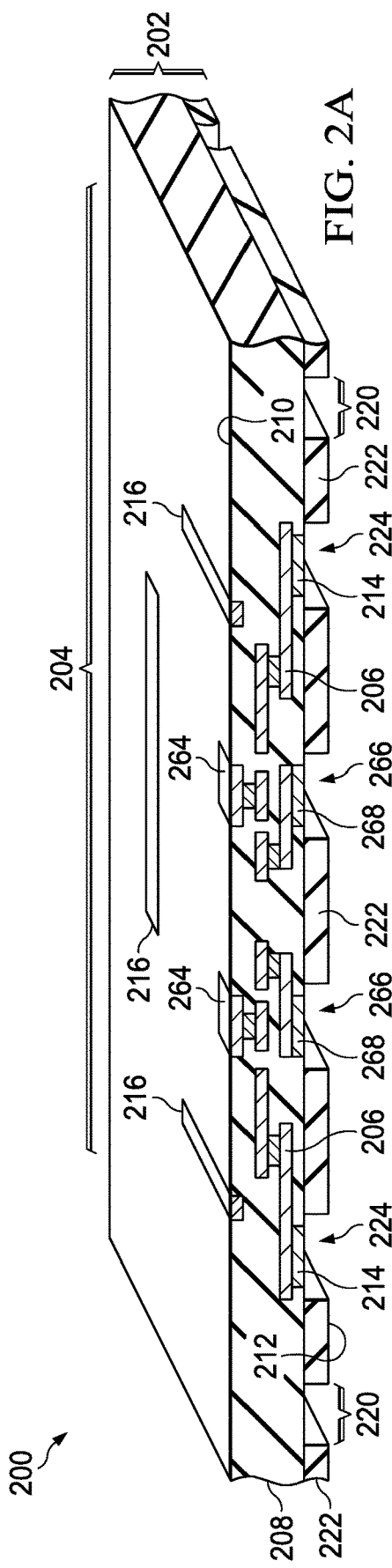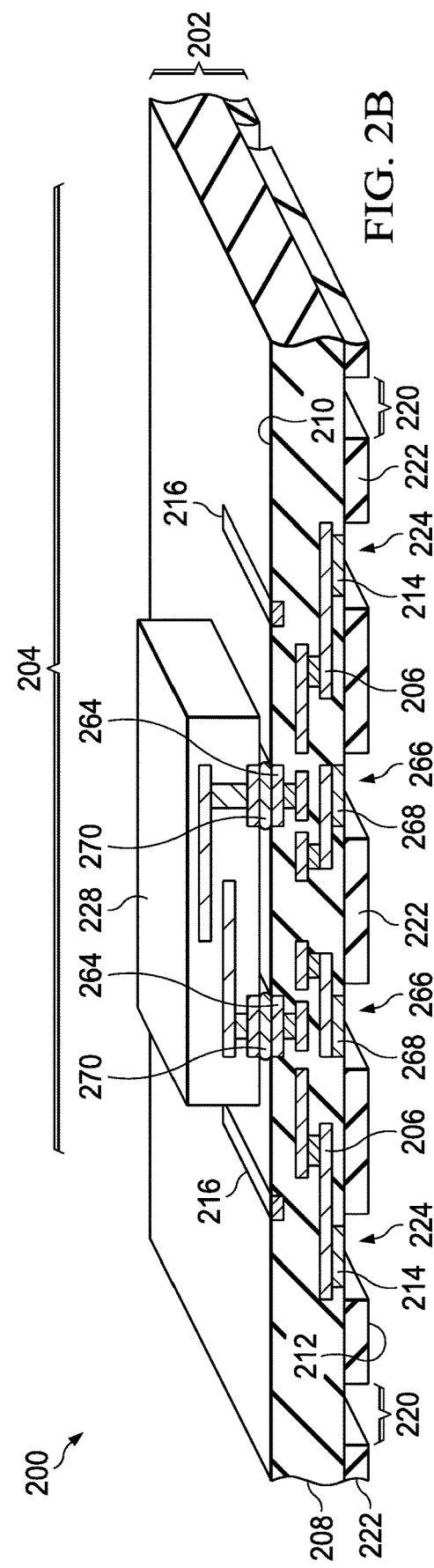

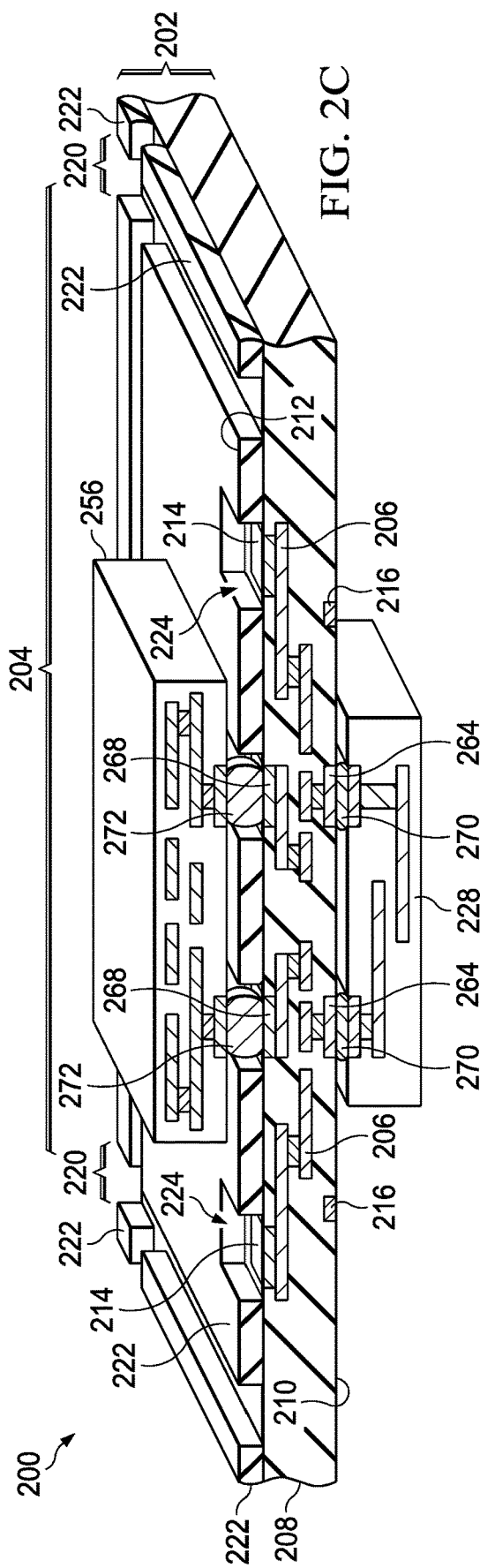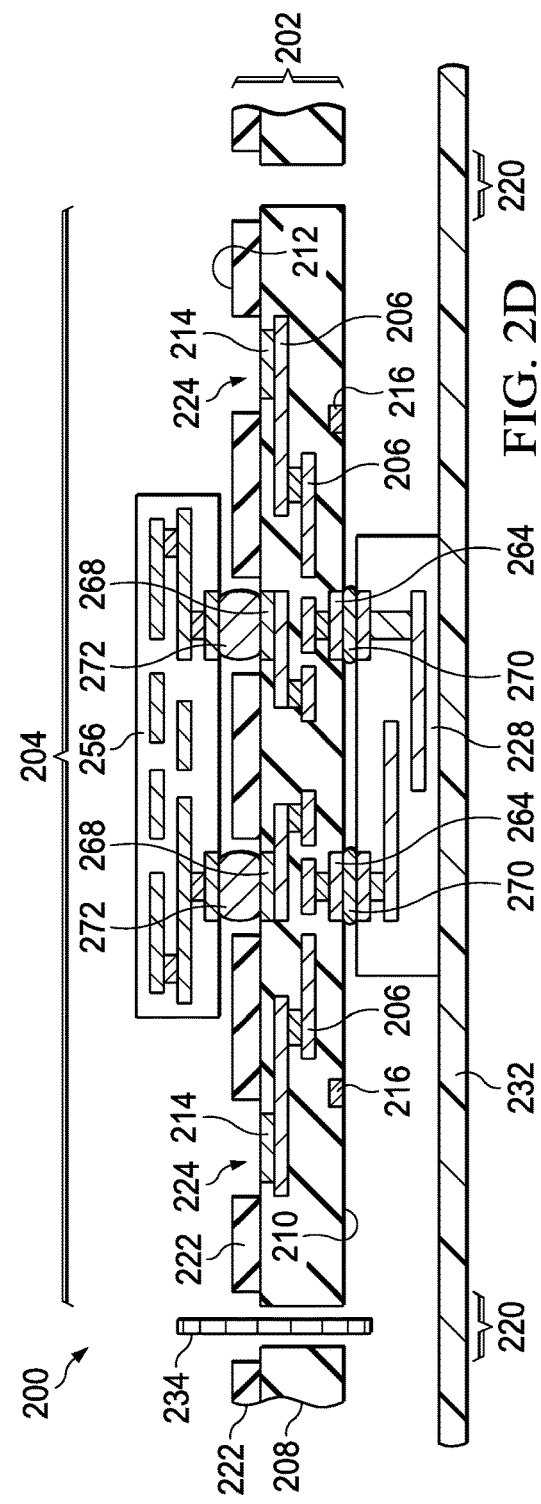

FLOATED SINGULATION

FIELD

This disclosure relates to the field of microelectronic devices. More particularly, this disclosure relates to singulation of substrates in microelectronic devices.

BACKGROUND

A microelectronic device may have a substrate attached to substrate pads, such as pads of a lead frame, on one face of the substrate. The microelectronic device may further have a component attached to the substrate on the same face of the substrate. Assembling the microelectronic device presents challenges. If the component is attached to the substrate before the substrate is attached to the substrate pads, the substrate must be singulated, and the component attached using expensive fixtures and complicated assembly processes. If the component is attached to the substrate after the substrate is attached to the substrate pads, the lead frame must be flipped to accommodate placing the component on the substrate. Both approaches incur undesirable fabrication costs and complexities.

SUMMARY

The present disclosure introduces a microelectronic device having a substrate attached to a substrate pad on a first face of the substrate. The substrate has a component placement guide which is detectable at the first face. A component is attached to the substrate on the first face of the substrate. The substrate has a singulation guide which is detectable at a second face of the substrate, located opposite from the first face.

The microelectronic device is formed by attaching the component to a substrate sheet which contains the substrate. The substrate sheet with the component is mounted on a singulation film so that the component contacts the singulation film, and the singulation guide on the substrate is located opposite from the singulation film. The substrate is singulated from the substrate sheet. The substrate with the component is attached to the substrate pad on the first face.

BRIEF DESCRIPTION OF THE VIEWS OF THE DRAWINGS

FIG. 1A through FIG. 1H are perspective views, cross sections, and top views of a microelectronic device having a substrate attached to substrate pads and a first component attached to the substrate on the same face, depicted in stages of an example method of formation.

FIG. 2A through FIG. 2F are perspective views, cross sections, and top views of a microelectronic device having a substrate attached to substrate pads and a first component attached to the substrate on the same face, depicted in stages of an example method of formation.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device includes a substrate attached to one or more substrate pads on a first face of the substrate. The substrate has a component placement guide which is detectable at the first face. The component placement guide may be detectable by visual inspection, optionally using a microscope, a camera, or another detection apparatus. The microelectronic device includes a first component attached to the substrate on the first face of the substrate. The substrate has a singulation guide which is detectable at a second face of the substrate, located opposite from the first face. The singulation guide may be detectable by visual inspection, a camera, or another detection apparatus. The microelectronic device may optionally include a second component attached to the second face of the substrate.

The microelectronic device is formed by attaching the component to a substrate sheet which contains the substrate. The substrate sheet may contain additional substrates, and additional components may be attached to the additional substrates. The substrate sheet with the component is mounted on a singulation film so that the component contacts the singulation film. The singulation guide on the substrate is located opposite from the singulation film. The substrate is singulated from the substrate sheet. The substrate with the component is attached to the substrate pad on the first face.

Figure 1C:
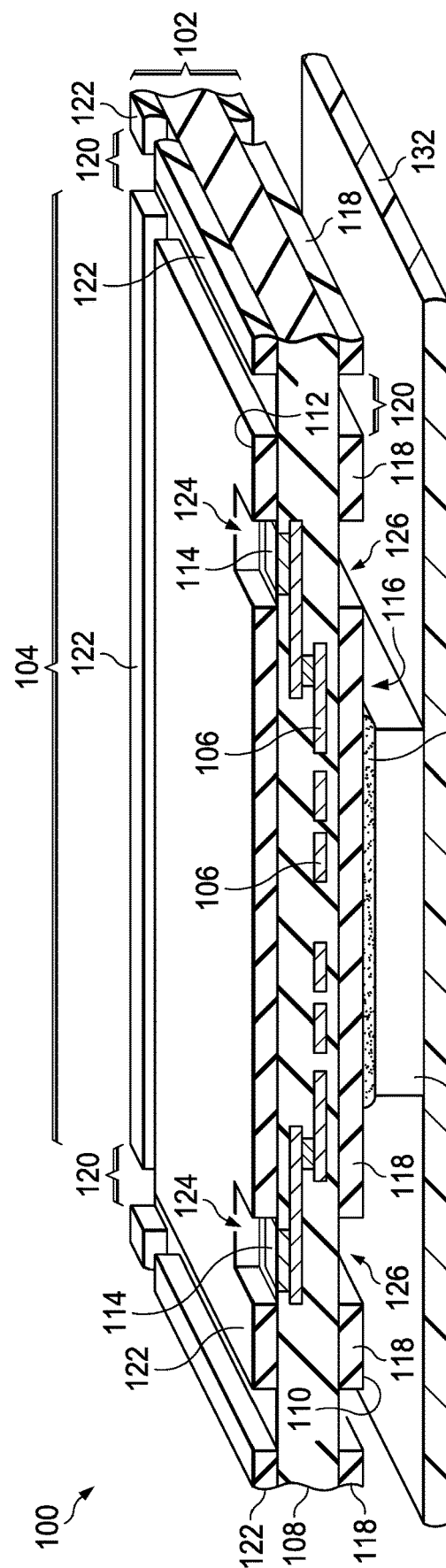

FIG. 1A through FIG. 1H are perspective views, cross sections, and top views of a microelectronic device having a substrate attached to substrate pads and a first component attached to the substrate on the same face, depicted in stages of an example method of formation. Referring to FIG. 1A, this example method of formation of the microelectronic device 100 starts with acquiring a substrate sheet 102. The substrate sheet 102 includes a substrate 104 of the microelectronic device 100. The substrate 104 may include electrical conductors 106 separated by one or more electrically non-conductive materials 108. The electrical conductors 106 may include, for example, copper traces, thick film conductors, aluminum interconnects, or wires. The one or more electrically non-conductive materials 108 may include, for example, layers of polymer, such as epoxy or polyester, optionally reinforced with fiberglass. The electrical conductors 106 may provide passive components such as a winding of an inductor, windings of a transformer, a resistor, or plates of a capacitor, or may provide electrical connections between components that are subsequently attached to the substrate 104.

The substrate 104 has a first face 110 and a second face 112 located opposite from, and parallel to, the first face 110. The substrate sheet 102 extends past the substrate 104 in at least one lateral direction, and may extend past the substrate 104 in all lateral directions, as indicated in FIG. 1A. The term "lateral" is used in this example to denote directions parallel to the first face 110 and the second face 112. A thickness of the substrate 104, that is, a distance between the first face 110 and the second face 112, may be, for example, 0.1 millimeters to 2 millimeters. Lateral dimensions of the substrate 104 may be, for example, 3 millimeters to 30 millimeters. The substrate sheet 102 may include additional substrates, not shown in FIG. 1A, for additional microelectronic devices, not shown in FIG. 1A. The substrate 104 may optionally include bond pads 114 at the second face 112.

The substrate 104 includes a component placement guide 116 which is detectable at the first face 110. The component placement guide 116 includes one or more features that provide an indication of a desired location for subsequently attaching a first component 128, shown in FIG. 1B, to the substrate 104 on the first face 110. The component placement guide 116 may be detectable by visual inspection, optionally using a microscope, a camera, or another detection apparatus. The component placement guide 116 may have, for example, a rectangle surrounding an area for the desired location, corner fiducials, such as crosses, at corners of the area for the desired location, or lines parallel to lateral edges of the area for the desired location. In this example, the substrate sheet 102 includes a first solder mask 118 at the first face 110. The first solder mask 118 is patterned to provide the component placement guide 116, which may be implemented as a rectangle surrounding the area for the desired location, as depicted in FIG. 1A. The component placement guide 116 may be visible to a camera of a pick and place tool, enabling automated placement of the first component 128 on the area for the desired location. Other implementations of the component placement guide 116 are within the scope of this example.

The substrate 104 includes a singulation guide 120 which is detectable at the second face 112. The singulation guide 120 includes features that provide an indication of desired paths for subsequently singulating the substrate 104 from the substrate sheet 102. The singulation guide 120 may be detectable by visual inspection, optionally using a microscope, a camera, or another detection apparatus. In this example, the substrate sheet 102 includes a second solder mask 122 at the second face 112. The second solder mask 122 is patterned to provide the singulation guide 120, which may be implemented as open paths, free of the second solder mask 122. The singulation guide 120 is visible to a camera of a singulation tool, such as a saw tool, enabling automated singulation of the substrate 104 from the substrate sheet 102. The second solder mask 122 may be patterned to have bond pad openings 124 which expose the bond pads 114 at the second face 112, if present. Other implementations of the singulation guide 120 are within the scope of this example.

In one version of this example, the first solder mask 118 and the second solder mask 122 may be patterned using a same photolithography mask, advantageously reducing a fabrication cost of the microelectronic device 100. Using the same photolithography mask to pattern the first solder mask 118 and the second solder mask 122 may result in the component placement guide 116 being implemented as a rectangle extending to desired paths for subsequently singulating the substrate 104, as depicted in FIG. 1A. Using the same photolithography mask to pattern the first solder mask 118 and the second solder mask 122 may result in dummy openings 126 in the first solder mask 118, corresponding to the bond pad openings 124 in the second solder mask 122; the dummy openings 126 do not expose any bond pads at the first face 110.

Referring to FIG. 1B, a first component 128 is attached to the substrate 104 on the first face 110. In versions of this example in which the substrate 104 includes a winding of an inductor or windings of a transformer, the first component 128 may be implemented as a slab of a magnetic material having a relative magnetic permeability greater than 1, to improve a quality factor, sometimes referred to as a Q-factor, of the inductor, or to improve a power transfer efficiency of the transformer. The first component 128 may include, for example, iron, nickel, or cobalt. In other versions of this example, the first component 128 may include one or more passive components such as a resistor, an inductor, or a capacitor. In further versions of this example, the first component 128 may include one or more active components such as a transistor, a diode, or an integrated circuit.

The first component 128 may be attached to the substrate 104 by an adhesive 130, as depicted in FIG. 1B. Alternatively, the first component 128 may be attached to the substrate 104 by solder, tape, or mechanical fasteners, for example. The first component 128 may have lateral edges aligned with the component placement guide 116.

Referring to FIG. 1C, the substrate sheet 102 and the first component 128 are mounted on a singulation film 132, so that the first component 128 contacts the singulation film 132. The singulation film 132 may be implemented as a saw film, for example. The substrate sheet 102 may be offset from the singulation film 132 by the first component 128, so that the substrate sheet 102 does not directly contact the singulation film 132, as depicted in FIG. 1C. The singulation film 132 may be held by a singulation frame, not shown in FIG. 1C, around a lateral perimeter of the singulation film 132.

Figure 1D:
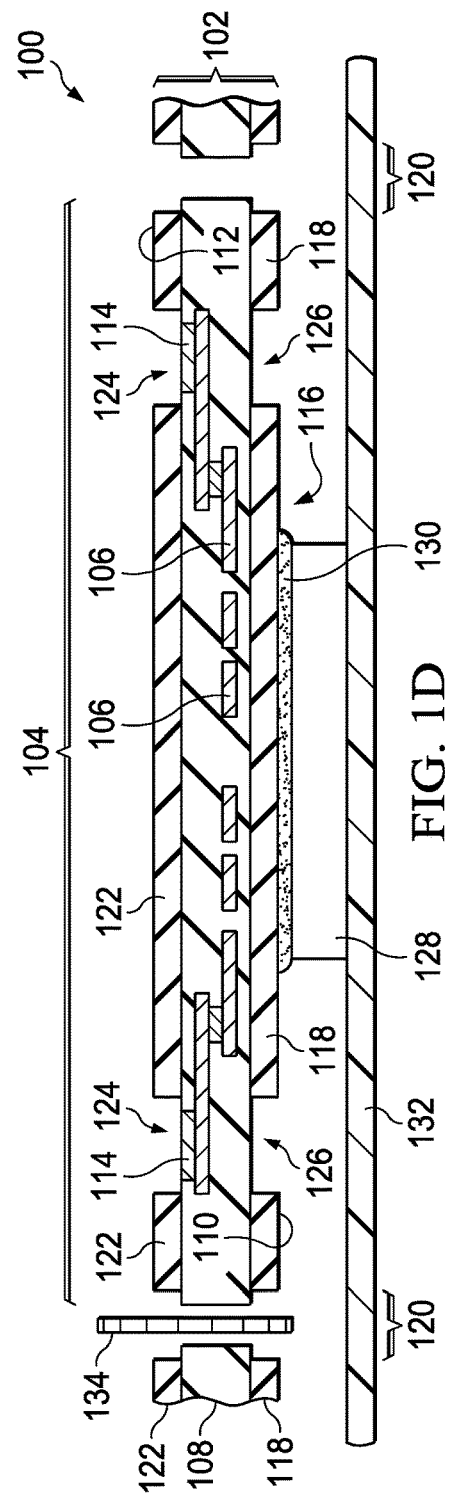

Referring to FIG. 1D, the substrate 104 is singulated from the substrate sheet 102 by a singulation process. The singulation process may be implemented as a saw process using a saw blade 134, as depicted in FIG. 1D. In versions of this example in which the singulation process is implemented as the saw process, the saw process may be performed so that the saw blade 134 does not cut into the singulation film 132 under the substrate 104, which may prolong a working life of the saw blade 134, advantageously reducing the fabrication cost of the microelectronic device 100. The substrate 104 may be singulated from the substrate sheet 102 along the singulation guide 120, as indicated in FIG. 1D. Other singulation methods, such as laser ablation, are within the scope of this example.

Referring to FIG. 1E, the substrate 104 is removed from the singulation film 132 of FIGS. 1D and 1s attached to substrate pads 136 of the microelectronic device 100. The substrate 104 is attached to the substrate pads 136 at the first face 110 of the substrate 104 at one or more locations adjacent to the first component 128. The substrate pads 136 may be implemented as parts of a lead frame 138, for example. The substrate 104 may be attached to substrate pads 136 using a first adhesive 140, as indicated in FIG. 1E. Other methods for attaching the substrate 104 to the substrate pads 136, such as soldering, taping, or welding, are within the scope of this example. Attaching the substrate 104 to the substrate pads 136 at the first face 110 may enable transferring the substrate 104 and the first component 128 from the singulation film 132 to the substrate pads 136 while maintaining a constant orientation of the first component 128 relative to the substrate 104, that is, maintaining the first component 128 below the substrate 104. When the substrate is attached to the substrate pads 136, the first component 128 lies in a recess defined between the plane along the bottom surface of the substrate pads 136 and the plane along the bottom surface of the substrate 104 and more specifically along the bottom surface of the solder mask 118 which is part of the substrate 104. Maintaining the constant orientation of the first component 128 relative to the substrate 104 may be performed by a tool which is configured to maintain the constant orientation during the transfer process. Conventional fabrication flows mount the substrate sheet 102 on the singulation film 132 with the substrate sheet 102 directly contacting the singulation film 132, necessitating a reversal of the orientation of the first component 128 relative to the substrate 104 during the transfer process, which requires a more expensive tool capable of reversing the orientation during the transfer, sometimes referred to as a flip-chip die bonder, compared to the tool configured to maintain the constant orientation during the transfer process. Thus, maintaining the constant orientation of the first component 128 relative to the substrate 104 during the transfer from the singulation film 132 to the substrate pads 136 may enable reduced fabrication cost for the microelectronic device 100.

Figure 1F:
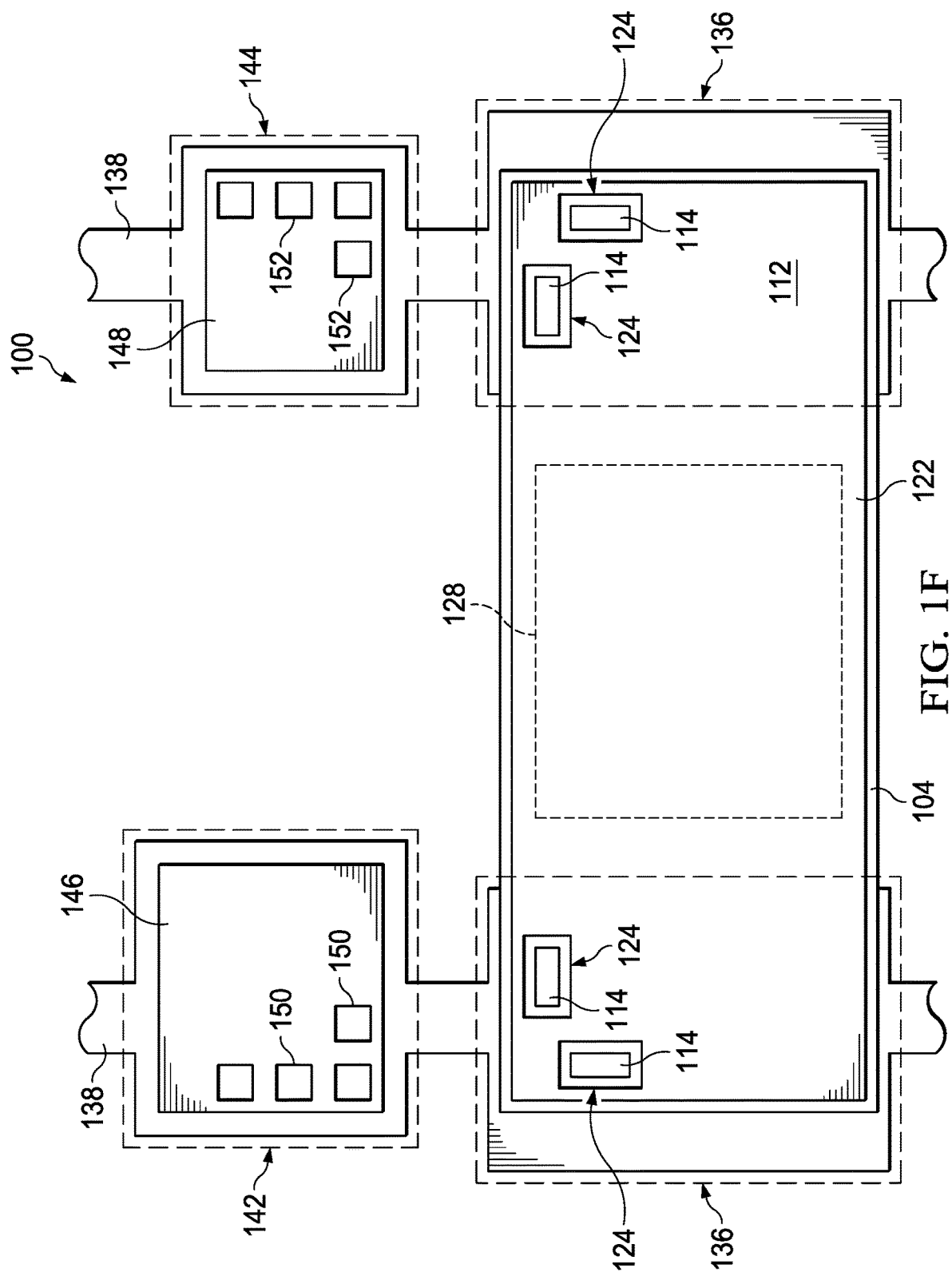

FIG. 1F is a top view of the microelectronic device 100. The lead frame 138 may include a first die pad 142 and a second die pad 144, optionally connected to the substrate pads 136 by portions of the lead frame 138. A first die 146 may be attached to the first die pad 142, and a second die 148 may be attached to the second die pad 144. The first die 146 may have first die bond pads 150, and the second die 148 may have second die bond pads 152. The first die 146 and the second die 148 may be implemented as integrated circuits, discrete semiconductor devices, or such.

Figure 1G:
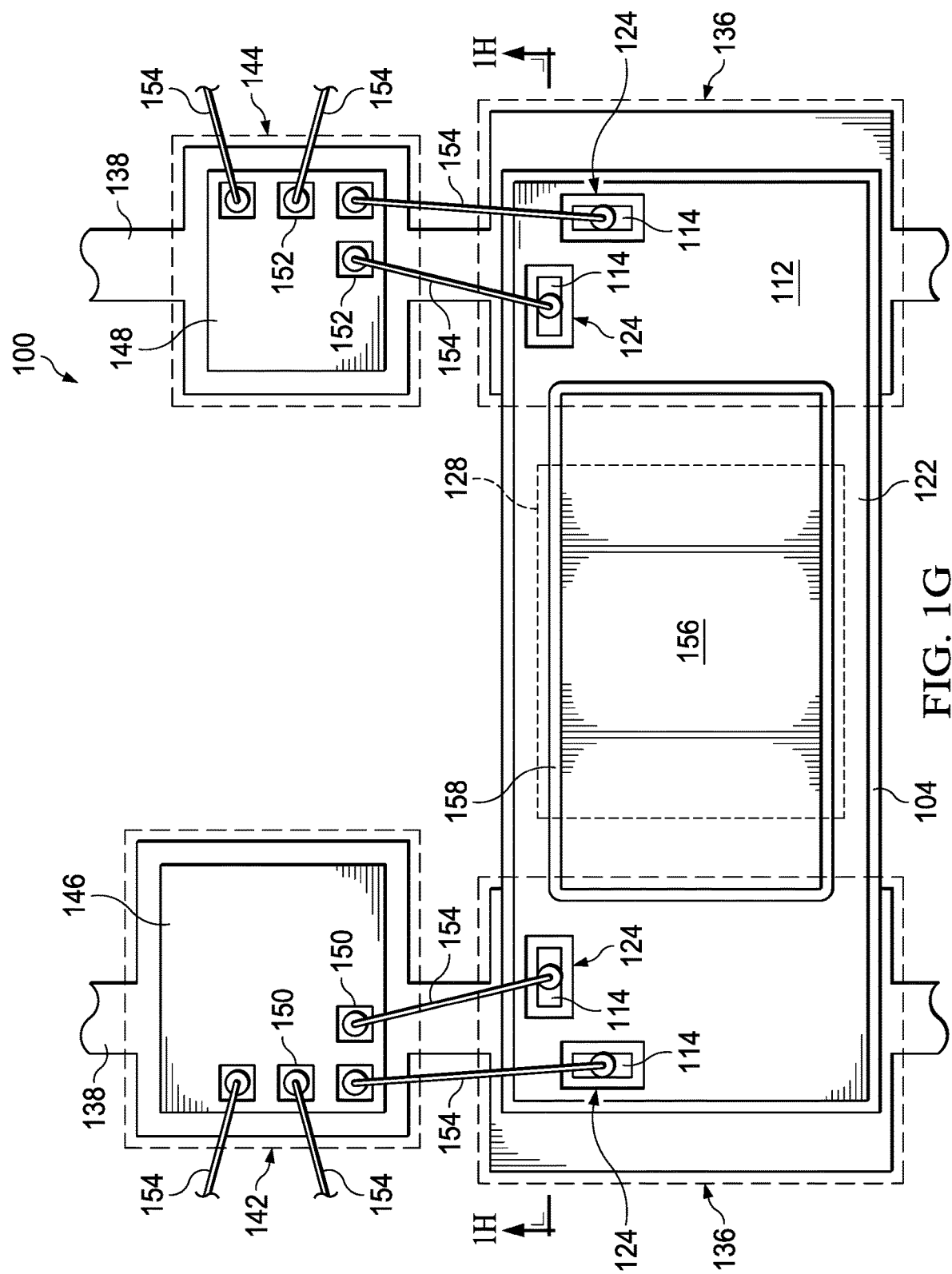

Referring to FIG. 1G, wire bonds 154 are formed to electrically couple the first die 146 to the substrate 104, and to couple the second die 148 to the substrate 104. The wire bonds 154 may also electrically couple the first die 146 and the second die 148 to external leads 160, shown in FIG. 1H, of the microelectronic device 100. The wire bonds 154 may terminate on the bond pads 114 of the substrate 104, the first die bond pads 150, and the second die bond pads 152, as depicted in FIG. 1G.

A second component 156 may optionally be attached to the substrate 104 on the second face 112. The second component 156 may be attached using a second adhesive 158, or by a solder, a tape, or by microwelds. In versions of this example in which the substrate 104 includes a winding of an inductor or windings of a transformer, the second component 156 may be implemented as a slab of a magnetic material having a relative magnetic permeability greater than 1, similar to the first component 128, to further improve the quality factor of the inductor, or to improve the power transfer efficiency of the transformer. In other versions of this example, the second component 156 may include one or more passive components such as a resistor, an inductor, or a capacitor. In further versions of this example, the second component 156 may include one or more active components such as a transistor, a diode, or an integrated circuit.

FIG. 1H is a cross section of the completed microelectronic device 100 through the substrate 104. The microelectronic device 100 includes the external leads 160, which may be parts of the lead frame 138. One or more of the wire bonds 154 may connect to one or more of the external leads 160. A package structure 162 is formed on the substrate 104, the first component 128, and the second component 156. The package structure 162 may include a polymer material, such as epoxy, formed by a molding process. The package structure 162 may extend partway onto the external leads 160, as depicted in FIG. 1H.

Figure 2E:
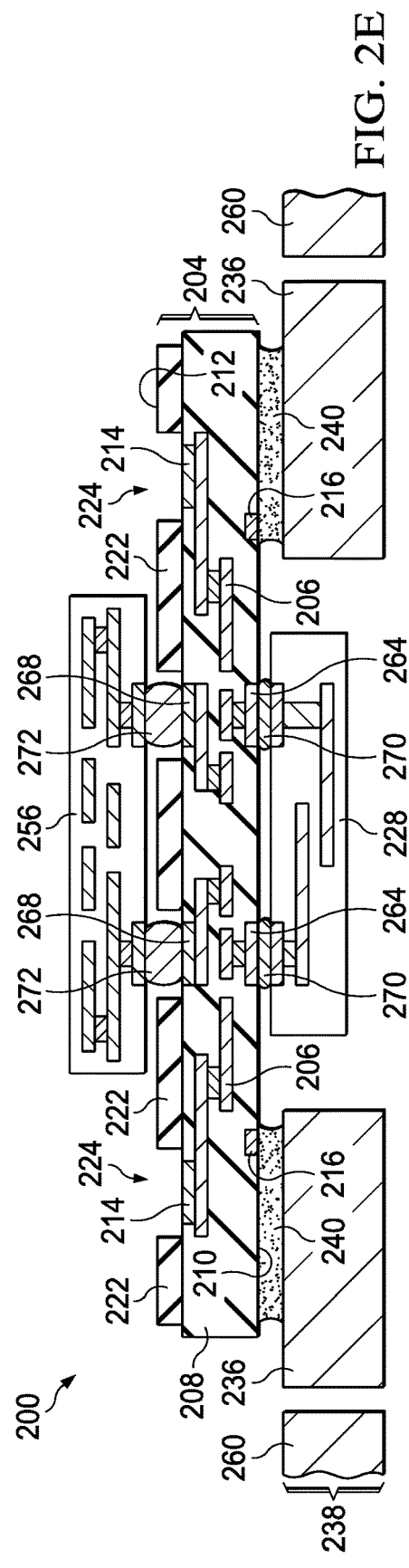

FIG. 2A through FIG. 2F are perspective views, cross sections, and top views of a microelectronic device having a substrate attached to substrate pads and a first component attached to the substrate on the same face, depicted in stages of an example method of formation. Referring to FIG. 2A, this example method of formation of the microelectronic device 200 starts with acquiring a substrate sheet 202. The substrate sheet 202 includes a substrate 204 of the microelectronic device 200. The substrate 204 may include electrical conductors 206 separated by one or more electrically non-conductive materials 208. The electrical conductors 206 may provide electrical connections between components that are subsequently attached to the substrate 204, or may provide passive components such as a winding of an inductor, windings of a transformer, a resistor, or plates of a capacitor.

The substrate 204 has a first face 210 and a second face 212 located opposite from, and parallel to, the first face 210. The substrate sheet 202 extends past the substrate 204 in at least one lateral direction, and may extend past the substrate 204 in all lateral directions. The term "lateral" is used in this example to denote directions parallel to the first face 210 and the second face 212. The substrate sheet 202 may include additional substrates, not shown in FIG. 2A, for additional microelectronic devices, not shown in FIG. 2A.

The substrate 204 includes a component placement guide 216 which is detectable at the first face 210. The component placement guide 216 includes one or more features that provide an indication of a desired location for subsequently attaching a first component 228, shown in FIG. 2B, to the substrate 204 on the first face 210. The component placement guide 216 may be detectable by visual inspection, a camera, or another detection apparatus. The component placement guide 216 may have, for example, lines parallel to lateral edges of the area for the desired location, a rectangle surrounding an area for the desired location, or corner fiducials, such as crosses, at corners of the area for the desired location. In this example, the substrate 204 may have a portion of the electrical conductors 206 extending to the first face 210, or proximate to the first face 210, to provide the component placement guide 216. The component placement guide 216 may be covered by a material layer, not shown in FIG. 2A, through which the component placement guide 216 can still be detected, such as a transparent layer of dielectric material. The component placement guide 216 is visible to a camera of a pick and place tool, enabling automated placement of the first component 228 on the area for the desired location. Other implementations of the component placement guide 216 are within the scope of this example.

In this example, the substrate 204 may further include first input/output (I/O) pads 264 extending to the first face 210. The first I/O pads 264 may include, for example, copper, nickel, palladium, gold, or platinum. The first I/O pads 264 may be electrically connected to the electrical conductors 206.

In this example, the substrate sheet 202 includes a solder mask 222 at the second face 212. The substrate 204 includes a singulation guide 220 at the second face 212, implemented as open paths in the solder mask 222. The singulation guide 220 includes features that provide an indication of desired paths for subsequently singulating the substrate 204 from the substrate sheet 202. The singulation guide 220 may be detectable by visual inspection, a camera, or another detection apparatus. The singulation guide 220 may be visible to a camera of a singulation tool, such as a saw tool, enabling automated singulation of the substrate 204 from the substrate sheet 202. Other implementations of the singulation guide 220 are within the scope of this example.

The solder mask 222 may have bond pad openings 224 which expose bond pads 214 at the second face 212. The bond pads 214 may include, for example, aluminum, copper, nickel, palladium, gold, or platinum. The bond pads 214 may be electrically connected to the electrical conductors 206. The solder mask 222 may have solder pad openings 266 which expose second I/O pads 268 at the second face 212. The second I/O pads 268 may include, for example, copper, nickel, palladium, gold, or platinum. The second I/O pads 268 may be electrically connected to the electrical conductors 206. For the purposes of this disclosure, the second face 212 includes external surfaces of the second I/O pads 268.

Referring to FIG. 2B, a first component 228 is attached to the substrate 204 on the first face 210. In this example, the first component 228 may include one or more active components such as a transistor, a diode, or an integrated circuit. Further, the first component 228 may include one or more passive components such as a resistor, an inductor, or a capacitor. In this example, the first component 228 may be implemented as an integrated circuit, a discrete semiconductor device, a microelectrical mechanical system (MEMS) device, an electro-optical device, or a microfluidics device, for example. In this example, the first component 228 may be attached to the substrate 204 by a solder process which forms solder connections 270 on the first I/O pads 264. The first component 228 may optionally be offset from the substrate 204 by the solder connections 270, nevertheless, for the purposes of this disclosure, the first component 228 is attached to the substrate 204 on the first face 210. Other methods for attaching the first component 228 are within the scope of this example, such as using an electrically conductive adhesive to form electrical connections on the first I/O pads 264.

Referring to FIG. 2C, a second component 256 is attached to the substrate 204 n the second face 212. FIG. 2C shows the substrate 204 above the first component 228, which is a vertically reversed orientation from FIG. 2B. In this example, the second component 256 may include one or more active components, and may further include one or more passive components. The second component 256 may be implemented as an integrated circuit, a discrete semiconductor device, a MEMS device, an electro-optical device, or a microfluidics device, for example. The second component 256 may be implemented as a different device type than the first component 228. The second component 256 may be attached to the substrate 204 by an adhesive process using an electrically conductive adhesive, which forms electrical connections 272 on the second I/O pads 268. The second component 256 may optionally be offset from the substrate 204 by the electrical connections 272, nevertheless, for the purposes of this disclosure, the second component 256 is attached to the substrate 204 on the second face 212.

Referring to FIG. 2D, the substrate sheet 202, the first component 228, and the second component 256 are mounted on a singulation film 232, so that the first component 228 contacts the singulation film 232. The substrate sheet 202 may be offset from the singulation film 232 by the first component 228, so that the substrate sheet 202 does not directly contact the singulation film 232, as depicted in FIG. 2D. The substrate 204 is singulated from the substrate sheet 202 by a singulation process, such as a saw process using a saw blade 234, as depicted in FIG. 2D. The substrate 204 may be singulated from the substrate sheet 202 along the singulation guide 220, as indicated in FIG. 2D. Other singulation methods, such as laser ablation, are within the scope of this example.

Referring to FIG. 2E, the substrate 204 is removed from the singulation film 232 of FIG. 2D and is attached to substrate pads 236 of the microelectronic device 200. The substrate pads 236 may be implemented as parts of a lead frame 238 having external leads 260, for example. The substrate 204 is attached to the substrate pads 236 at the first face 210 of the substrate 204 at one or more locations adjacent to the first component 228. The substrate 204 may be attached to substrate pads 236 using an adhesive 240. Other methods for attaching the substrate 204 to the substrate pads 236, such as soldering, taping, or welding, are within the scope of this example. Attaching the substrate 204 to the substrate pads 236 at the first face 210 may enable transferring the substrate 204 and the first component 228 from the singulation film 232 to the substrate pads 236 while maintaining a constant orientation of the first component 228 relative to the substrate 204, accruing the advantage described in reference to FIG. 1E.

Figure 2F:
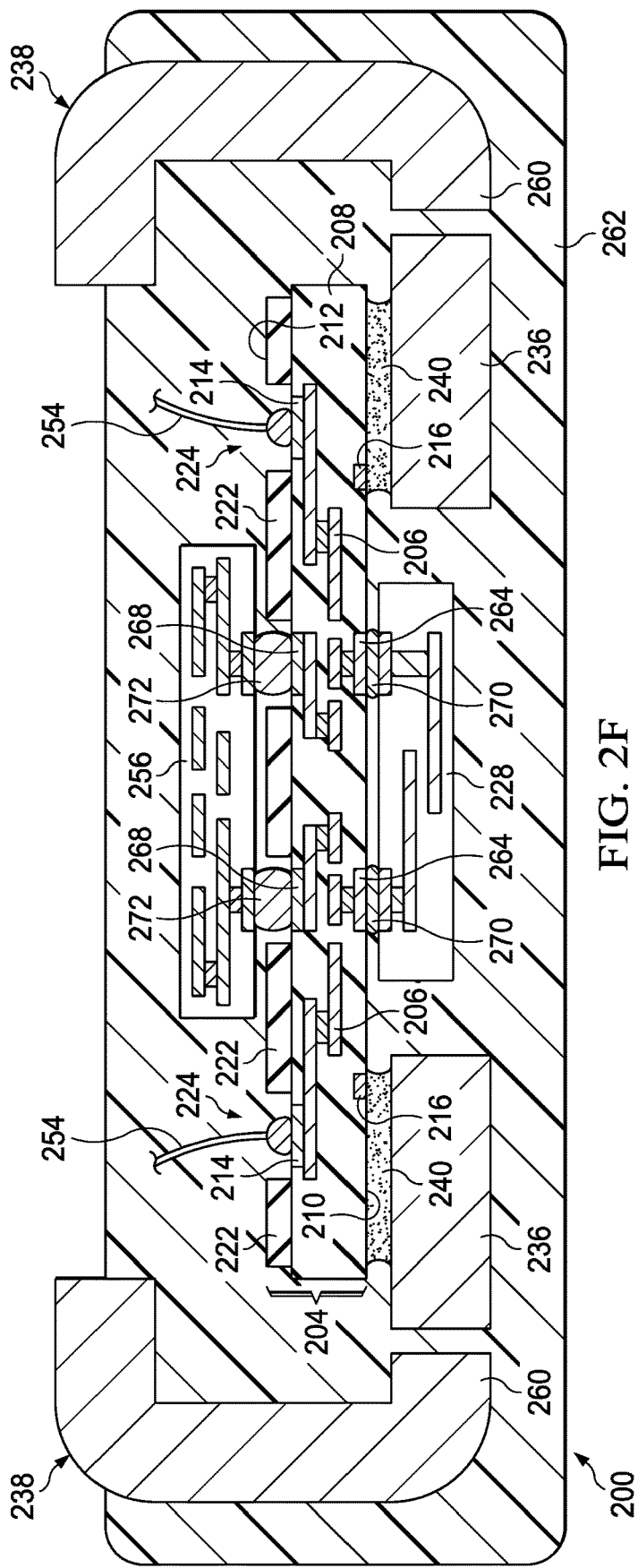

Referring to FIG. 2F, wire bonds 254 are formed to make electrical connections to the substrate 204. The wire bonds 254 may electrically couple the substrate 204 to the external leads 260, for example. The wire bonds 254 may terminate on the bond pads 214 of the substrate 204, as depicted in FIG. 2F. Formation of the microelectronic device 200 may be continued by forming a package structure 262 that contains the substrate 204, the first component 228, and the second component 256. The external leads 260 may be shaped to provide a dual-flat no-leads (DFN) configuration or a quad-flat no-leads (QFN) configuration.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a substrate including a first face and a second face, wherein the second face is located opposite from the first face, the substrate including a component placement guide at the first face; and
   a magnetic material attached to the substrate on a first portion of the first face;
   wherein a first portion of the first face of the substrate is attached to a top surface of a first substrate pad via an adhesive, and wherein the magnetic material is in a recess defined between a plane along a bottom surface of the first substrate pad and a plane along a bottom surface of the substrate, wherein the first face has a first solder mask thereon and the second face has a second solder mask thereon, and the first solder mask and the second solder mask have a substantially same pattern.

2. The microelectronic device of claim 1, further including a second substrate pad, wherein a second portion of the first face of the substrate is attached to a top surface of a second substrate pad via the adhesive.

3. The microelectronic device of claim 1, wherein:
   the substrate includes windings of a transformer; and
   the magnetic material includes a relative magnetic permeability greater than 1.

4. The microelectronic device of claim 1, further including a second component attached to the second face.

5. The microelectronic device of claim 1, wherein the component placement guide includes the first sold mask.

6. The microelectronic device of claim 1, wherein the component placement guide includes a rectangle in the first sold mask.

7. The microelectronic device of claim 1, wherein the component placement guide includes electrical conductors in the substrate.

8. The microelectronic device of claim 1, further including a die attached to a die pad of the microelectronic device, the die being electrically coupled to the substrate, wherein the die is selected from the group consisting of an integrated circuit, a discrete semiconductor device, a microelectrical mechanical system (MEMS) device, an electro-optical device, and a microfluidics device.

9. A microelectronic device, comprising:
a substrate including a first face and a second face, opposite to the first face;
a first solder mask on the first face and a second solder mask on the second face, wherein a bond pad of the substrate is exposed between portions of the second solder mask;
a passive component or a magnetic material attached to the first solder mask; and
a substrate pad attached to a portion of the first face and a portion of the first solder mask via an adhesive, wherein a portion of the substrate horizontally projects outwards beyond the outer edges of each of the first solder mask and the second solder mask in a cross-sectional side view of the microelectronic device.

10. The microelectronic device of claim 9, wherein the passive component includes one of a resistor, an inductor, and a capacitor.

11. The microelectronic device of claim 9, wherein the magnetic material includes a relative magnetic permeability greater than 1.

12. The microelectronic device of claim 9, wherein the substrate includes windings of a transformer.

13. The microelectronic device of claim 9 further comprising a die attach pad mechanically connected to the substrate pad.

14. The microelectronic device of claim 13 further comprising a die attached to the die attach pad and electrically connected to the substrate.

* * * * *